United States Patent
Chang et al.

(10) Patent No.: US 10,790,846 B2
(45) Date of Patent: Sep. 29, 2020

(54) SUCCESSIVE APPROXIMATION REGISTER ANALOG-TO-DIGITAL CONVERTER AND CONTROL METHOD THEREOF

(71) Applicant: Nuvoton Technology Corporation, Hsinchu Science Park (TW)

(72) Inventors: Szu-Wei Chang, Taoyuan (TW); Che-Hao Chiang, Yuanlin (TW); Tu-Hsiu Wang, New Taipei (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 16/533,245

(22) Filed: Aug. 6, 2019

(65) Prior Publication Data
US 2020/0106454 A1    Apr. 2, 2020

(30) Foreign Application Priority Data

Sep. 28, 2018 (TW) ............................. 107134374 A (51) Int. Cl.
*H03M 1/38* (2006.01)

(52) U.S. Cl.
CPC .................................... *H03M 1/38* (2013.01)

(58) Field of Classification Search
CPC ............ H03M 1/38; H03M 1/00; H03M 1/12; H03M 1/802; H03M 1/804; H03M 1/806
USPC .................................................. 341/161, 155
See application file for complete search history.

(56) References Cited

U.S. PATENT DOCUMENTS

| 6,731,232 | B1 | 5/2004 | Kearney | |
|---|---|---|---|---|
| 7,773,024 | B2 | 8/2010 | Ohnhauser et al. | |
| 8,599,059 | B1 * | 12/2013 | Chung | H03M 1/466 341/163 |
| 8,730,083 | B2 * | 5/2014 | Ishii | H03M 1/687 341/136 |
| 8,854,059 | B2 * | 10/2014 | Cormier, Jr. | G06F 3/044 324/678 |
| 8,860,600 | B1 * | 10/2014 | Yang | H03M 1/466 341/172 |
| 8,907,826 | B2 | 12/2014 | Hong et al. | |
| 9,013,442 | B2 | 4/2015 | Hotelling et al. | |

(Continued)

FOREIGN PATENT DOCUMENTS

| EP | 1303048 A1 | 4/2003 |
|---|---|---|
| TW | I524678 B | 4/2003 |

*Primary Examiner* — Jean B Jeanglaude
(74) *Attorney, Agent, or Firm* — Muncy, Geissler, Olds & Lowe, P.C.

(57) ABSTRACT

A successive approximation register analog-to-digital converter including a first capacitor group, a second capacitor group and a control circuit is provided. Each of the first and second capacitor groups includes a plurality of capacitors coupled to a common node. In a sampling mode, the control circuit provides an analog signal to the first capacitor group and provides a first voltage to the common node and the second capacitor group. In a sampling mode, the control circuit stops providing the first voltage to the common node and provides a second voltage to the second capacitor group. In a data converting mode, the control circuit reads voltage values of the capacitors of the first capacitor group in sequence. Each when the voltage of at least one specific capacitor in the first capacitor group is read, one capacitor of the second capacitor group is electrically floated.

20 Claims, 10 Drawing Sheets

(56) References Cited

U.S. PATENT DOCUMENTS

| | | | |
|---|---|---|---|
| 9,319,059 B1 | 4/2016 | Sharma et al. | |
| 9,432,046 B1 * | 8/2016 | Yu | H03M 1/468 |
| 9,654,127 B1 * | 5/2017 | Lin | H03M 1/06 |
| 9,673,832 B2 * | 6/2017 | Tsai | H03M 1/0636 |
| 2014/0320330 A1 * | 10/2014 | Yang | H03M 1/12 |
| | | | 341/172 |

* cited by examiner

SUCCESSIVE APPROXIMATION REGISTER ANALOG-TO-DIGITAL CONVERTER AND CONTROL METHOD THEREOF

CROSS-REFERENCE TO RELATED APPLICATION

This application claims the benefit of Taiwan Patent Application No. 107134374, filed on Sep. 28, 2018, in the Taiwan Intellectual Property Office, the disclosure of which is incorporated herein in its entirety by reference.

BACKGROUND OF THE INVENTION

1. Field of the Invention

The present invention relates to an analog-to-digital converter (ADC), and more particularly to a successive approximation register analog-to-digital converter (SAR ADC).

2. Description of the Related Art

With the advancement of technology, types and functions of electronic products are increasing, so that most electronic products comprise analog-to-digital converters for converting analog signals into digital signals for other components to use.

SUMMARY OF THE INVENTION

An objective of the present invention is to provide a successive approximation register analog-to-digital converter, to solve the conventional problem.

In order to achieve the objective, the present invention provides a successive approximation register analog-to-digital converter, which can be applied to convert a first analog signal into a digital signal. The successive approximation register analog-to-digital converter can include a first capacitor group, a first capacitor group, a comparator circuit and a control circuit. The first capacitor group includes a plurality of capacitors coupled to a common node. The second capacitor group includes a plurality of capacitors coupled to the common node. The comparator circuit includes a first input terminal and a second input terminal, and is configured to generate a comparison result according to voltages of the first input terminal and the second input terminal, wherein the first input terminal is coupled to the common node. The control circuit is configured to generate the digital signal according to the comparison result. When the control circuit is operated in a sampling mode, within a first period the control circuit provides a first analog signal to the all capacitors of the first capacitor group and provides a first voltage to the common node and the all capacitors of the second capacitor group, and within a second period the control circuit stops providing the first voltage to the common node, and provides a second voltage to the all capacitors of the second capacitor group. When the control circuit is operated in a data converting mode, the control circuit reads the voltage values of the capacitors of the first capacitor group in sequence, and when the control circuit reads a voltage value of at least one specific capacitor of the first capacitor group, the control circuit makes one of the capacitors of the second capacitor group electrically floating.

In order to achieve the objective, the present invention provides a control method applicable to a successive approximation register analog-to-digital converter, which includes a first capacitor group, a second capacitor group and a comparator circuit, and the first capacitor group and the second capacitor group are coupled to an input terminal of the comparator circuit. The control method comprises following steps of: within a first period, providing an analog signal to the first capacitor group, and providing a first voltage to the second capacitor group and the input terminal of the comparator circuit; within a second period, stopping providing the first voltage to the input terminal of the comparator circuit; and providing a second voltage to the second capacitor group; within a third period, reading voltage values of the plurality of capacitors of the first capacitor group in sequence; and making a capacitor of the second capacitor group electrically floating when a voltage value of at least one specific capacitor of the first capacitor group is read.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be acknowledged to imply the inclusion of stated elements but not the exclusion of any other elements.

Figure 1:
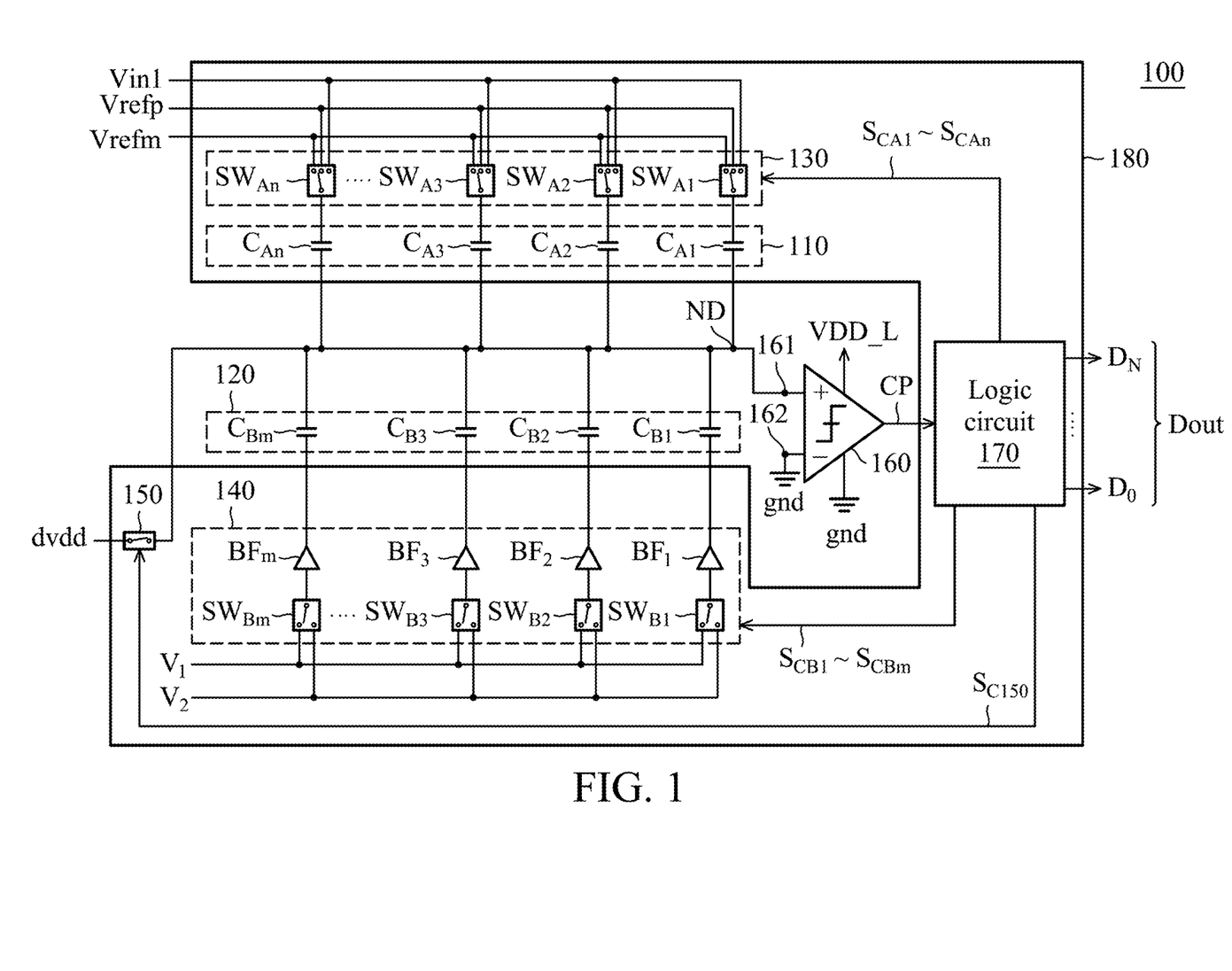
FIG. 1 is a schematic view of an embodiment of a successive approximation register analog-to-digital converter of the present invention.

FIG. 1 is a schematic view of an embodiment of a successive approximation register analog-to-digital converter of the present invention. The successive approximation register analog-to-digital converter 100 can convert an analog signal Vin1 into a digital signal Dout. The digital signal Dout is formed by a plurality of bits $D_0 \sim D_N$. In this embodiment, the successive approximation register analog-to-digital converter 100 can comprise capacitor groups 110 and 120, switching circuits 130, 140 and 150, a comparator circuit 160 and a logic circuit 170.

The capacitor group 110 can comprise capacitors $C_{A1} \sim C_{An}$. The capacitors $C_{A1} \sim C_{An}$ are coupled to a common node ND together. The present invention does not limit the number of the capacitors of the capacitor group 110. In an embodiment of the present invention, the number of the capacitors of the capacitor group 110 relates to the number of bits of the digital signal Dout, for example, when the number of the capacitors of the capacitor group 110 is higher, the number of the bits of the digital signal Dout becomes higher, so that the successive approximation register analog-to-digital converter 100 can have a higher resolution. In this embodiment, the capacitance value of each of the capacitors $C_{A2} \sim C_{An}$ can be an integer multiple of that of the capacitor $C_{A1}$, for example, the capacitance value of the capacitor $C_{A2}$ can be two times of that of the capacitor $C_{A1}$, and the capacitance value of the capacitor $C_{A3}$ can be two times of that of the capacitor $C_{A2}$.

The capacitor group 120 can comprise capacitors $C_{B1} \sim C_{Bm}$. The capacitors $C_{B1} \sim C_{Bm}$ are coupled to the common node ND together. However, the number of the capacitors of the capacitor group 120 of the present invention is not limited to above-mentioned example. In an embodiment, the number of the capacitors of the capacitor group 120 can be equal to the number of the capacitors of the capacitor group 110. In another embodiment, the number of the capacitors of the capacitor group 120 can be less than the number of the capacitors of the capacitor group 110, for example, the number of the capacitors of the capacitor group 120 can be a half of the number of the capacitors of the capacitor group 110. In this embodiment, the capacitance value of each of capacitors $C_{B2} \sim C_{Bm}$ can be an integer multiple of that of the capacitor $C_{B1}$, for example, the capacitance value of the capacitor $C_{B2}$ can be two times of that of the capacitor $C_{B1}$, and the capacitance value of the capacitor $C_{B3}$ can be two times of that of the capacitor $C_{B2}$. In other embodiment, a sum of the capacitance values of the capacitors of the capacitor group 120 can be equal to a sum of the capacitance values of the capacitors of the capacitor group 110.

The switching circuit 130 is coupled to the capacitor group 110, and configured to receive the analog signal Vin1, and reference voltages Vrefp and Vrefm. In this embodiment, the switching circuit 130 comprises switches $SW_{A1} \sim SW_{An}$. The switches $SW_{A1} \sim SW_{An}$ are coupled to the capacitors $C_{A1} \sim C_{An}$ in one-to-one correspondence, for example, the switch $SW_{A1}$ is coupled to the capacitor $C_{A1}$, and the switch $SW_{An}$ is coupled to the capacitor $C_{An}$. In an embodiment, according to a control signal, each of the switches SWA1~SWAn can transmit the analog signal Vin1, and the reference voltage Vrefp or Vrefm to the capacitor corresponding thereto. For example, the switch $SW_{A1}$ can transmit the analog signal Vin1, and the reference voltage Vrefp or Vrefm to the capacitor $C_{A1}$ according to the control signal $S_{CA1}$. Similarly, the switch $SW_{An}$ can transmit the analog signal Vin1, the reference voltage Vrefp or Vrefm to the capacitor $C_{An}$ according to the control signal $S_{CAn}$. In an embodiment, the reference voltage Vrefp can be higher than the reference voltage Vrefm.

The switching circuit 140 is coupled to the capacitor group 120 and configured to receive the voltages $V_1$ and $V_2$. In this embodiment, the switching circuit 140 can comprise switches $SW_{B1} \sim SW_{Bm}$. The switches $SW_{B1} \sim SW_{Bm}$ are coupled to the capacitors $C_{B1} \sim C_{Bm}$ in one-to-one correspondence, for example, the switch $SW_{B1}$ is coupled to the capacitor $C_{B1}$, and the switch $SW_{Bm}$ is coupled to the capacitor $C_{Bm}$. According to a control signal, each of switches $SW_{B1} \sim SW_{Bm}$ can transmit the voltage $V_1$ or $V_2$ to the capacitor corresponding thereto, for example, the switches $SW_{B1}$ can transmit the voltage $V_1$ or $V_2$ to the capacitor $C_{B1}$ according to the control signal $S_{CB1}$, and the switch $SW_{Bm}$ can transmit the voltage $V_1$ or $V_2$ to the capacitor $C_{Bm}$ according to the control signal $S_{CBm}$. In other embodiment, each of the switches $SW_{B1} \sim SW_{Bm}$ can stop transmitting the voltages $V_1$ and $V_2$ to the capacitor corresponding thereto, according to the corresponding control signal. For example, when the switch $SW_{B1}$ stops transmitting the voltages $V_1$ and $V_2$ to the capacitor $C_{B1}$ according to the control signal $S_{CB1}$, and the capacitor $C_{B1}$ is at an electrically floating status. In an embodiment, the voltage $V_1$ can be higher than the voltage $V_2$. In another embodiment, the voltage $V_1$ can be lower than the voltage $V_2$.

In an embodiment, the switching circuit 140 can comprise buffer $BF_1 \sim BF_m$. Each of the buffers $BF_1 \sim BF_m$ is coupled between the corresponding capacitor and the corresponding switch, and configured to amplify the voltage outputted from the corresponding switch of the switches $SW_{B1} \sim SW_{Bm}$. For example, the buffer $BF_1$ is coupled between the capacitor $C_{B1}$ and the switch $SW_{B1}$, and the buffer $BF_m$ is coupled between the capacitor $C_{Bm}$ and the switch $SW_{Bm}$. In other embodiment, the buffers $BF_1 \sim BF_m$ can be omitted. In this example, the capacitors $C_{B1} \sim C_{Bm}$ can be directly coupled to the switches $SW_{B1} \sim SW_{Bm}$.

The switching circuit 150 is coupled to a common node ND, and configured to provide the voltage dvdd to the common node ND according to the control signal $S_{C150}$. In an embodiment, the voltage dvdd can be equal to the voltage $V_1$.

The comparator circuit 160 can comprise a non-inverting input terminal 161 and an inverting input terminal 162. In this embodiment, the non-inverting input terminal 161 of the comparator circuit 160 is coupled to the common node ND, and the inverting input terminal 162 of the comparator circuit 160 receives a ground voltage gnd. The comparator circuit 160 can compare the voltages of the non-inverting input terminal 161 and the inverting input terminal 162 to generate a comparison result CP. In this embodiment, the operation voltages of the comparator circuit 160 are voltage VDD_L and voltage gnd, and the voltage VDD_L is higher than the voltage gnd. After the comparator circuit 160 receives the voltage VDD_L and ground voltage gnd, the comparator circuit 160 starts to compare the voltages of the non-inverting input terminal 161 and the inverting input terminal 162. In an embodiment, the voltage dvdd and the voltage $V_1$ can be equal to the voltage VDD_L, and the voltage $V_2$ can be equal to the voltage gnd. In another embodiment, the voltage dvdd and the voltage $V_1$ can be equal to the voltage VDD_L, the voltage $V_2$ can be equal to a digital ground voltage. In an embodiment, the voltage $V_2$ can be a negative voltage.

The logic circuit 170 can generate a digital signal Dout, and the control signals $S_{CA1} \sim S_{CAn}$, $S_{CB1} \sim S_{CBm}$, and $S_{C150}$, according to the comparison result CP. The control signals $S_{CA1} \sim S_{CAn}$ are used to control the switches $SW_{A1} \sim SW_{An}$. The control signals $S_{CB1} \sim S_{CBm}$ are used to control the switches $SW_{B1} \sim SW_{Bm}$. The control signal $S_{C150}$ is used to control the switching circuit 150. In an embodiment, the logic circuit 170 and the switching circuits 130, 140 and 150 can form a control circuit 180 configured to determine the voltages provided to the capacitor groups 110 and 120.

For example, when the control circuit 180 is operated in a sampling mode, within a first period the control circuit 180 can provide the analog signal Vin1 to the capacitors $C_{A1} \sim C_{An}$ of the capacitor group 110, and provide the voltage dvdd to the common node ND. Within the first period, the control circuit 180 can also provide the voltage $V_1$ to the capacitors $C_{B1} \sim C_{Bm}$ of the capacitor group 120.

However, the manner that the control circuit 180 provides the voltage to the capacitor groups 110 and 120 is not limited in the present invention. In an embodiment, the logic circuit 170 can generate the control signals $S_{CA1} \sim S_{CAn}$, $S_{CB1} \sim S_{CBm}$ and $SC_{150}$, according to codes stored therein. For example, according to the control signals $SC_{A1} \sim SC_{An}$, the logic circuit 170 can control the switches $SW_{A1} \sim SW_{An}$ to transmit the analog signal Vin1 to the capacitors $C_{A1} \sim C_{An}$, respectively. In this example, according to the control signals $S_{CB1} \sim S_{CBm}$, the logic circuit 170 can control the switches $SW_{B1} \sim SW_{Bm}$ to transmit the voltage $V_1$ to the capacitors $C_{B1} \sim C_{Bm}$, respectively, and control the switching circuits 150 to transmit the voltage dvdd to the common node ND according to the control signal $S_{C150}$.

Within a second period of the sampling mode, the control circuit 180 stops providing the voltage dvdd to the common node ND, and provides the voltage $V_2$ to all capacitors $C_B1 \sim C_{Bm}$ of the capacitor group 120. At this time, the control circuit 180 continuously provides the analog signal Vin1 to the capacitors $C_{A1} \sim C_{An}$ of the capacitor group 110.

In an embodiment, the logic circuit 170 can execute the codes stored therein to control the switches $SW_{B1} \sim SW_{Bm}$, to transmit the voltage $V_2$ to the capacitors $C_{B1} \sim C_{Bm}$, respectively, according to the control signals $S_{CB1} \sim S_{CBm}$, and controls the switching circuit 150, according to the control signal $S_{C150}$, to stop transmitting the voltage dvdd to the common node ND. In this example, the logic circuit 170 can maintain the control signals $S_{CA1} \sim S_{CAn}$ to control the switches $SW_{A1} \sim SW_{An}$ to continuously transmit the analog signal Vin1 to the capacitors $C_{A1} \sim C_{An}$.

The capacitor group 120 is coupled to the common node ND and the switching circuit 140 can provide different voltage to the capacitor group 120 in different period, so the voltage of the common node ND can be adjusted. For example, it is assumed that the total capacitance value of the capacitor group 120 is equal to the total capacitance value of the capacitor group 110. In this example, when the voltage outputted from the switching circuit 140 is changed from the voltage $V_1$ to the voltage $V_2$, the capacitor groups 110 and 120 are connected in series between the analog signal Vin1 and the voltage $V_2$. When the voltage $V_2$ is the ground voltage gnd, the voltage on the common node ND is about half of the voltage dvdd.

In a condition that the voltage of the common node ND is pulled low and the voltage of the non-inverting input terminal 161 of the comparator circuit 160 becomes lower, so it is not necessary to use a high-voltage device to implement the comparator circuit 160 and a device cost of the comparator circuit 160 can be reduced. Furthermore, adjusting the capacitance values of the capacitors $C_{B1} \sim C_{Bm}$ of the capacitor group 120 can adjust the voltage on the common node ND without additionally using a voltage generating circuit.

When the control circuit 180 leaves from the sampling mode and enters a data converting mode, the control circuit 180 reads the voltage values of the capacitors $C_{A1} \sim C_{An}$ of the capacitor group 110 in sequence. When the control circuit 180 reads the voltage value of at least one specific capacitor of the capacitor group 110, the control circuit 180 makes a capacitor of the capacitor group 120 electrically floating. The manner that the control circuit 180 reads the voltage values of the capacitors $C_{A1} \sim C_{An}$ is not limited in the present invention. The details of the operation of using the control circuit 180 to read the voltage values of the capacitors $C_{A1} \sim C_{An}$ will be described in following paragraph with reference to FIGS. 5A to 5E.

Figure 2:
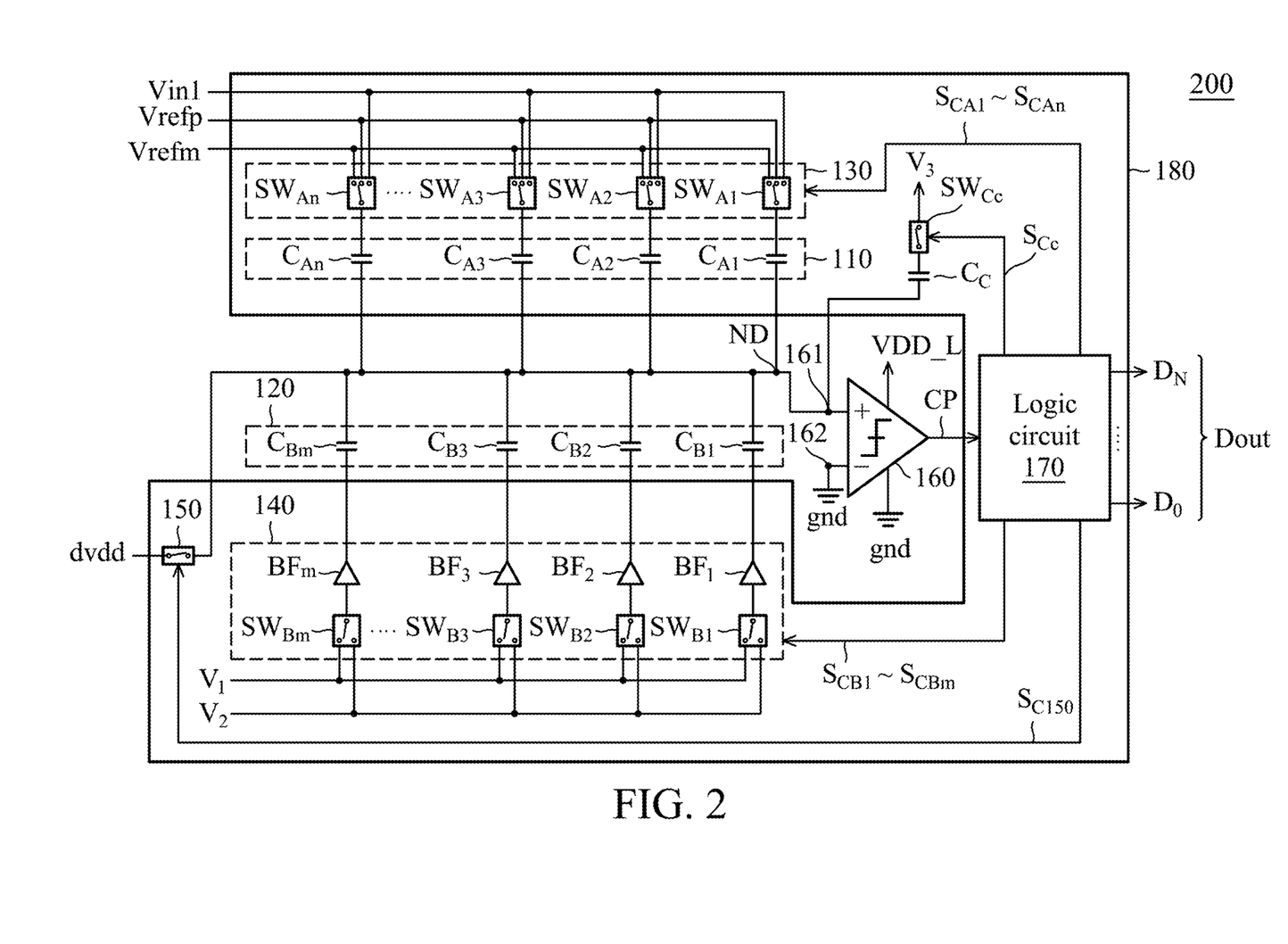
FIG. 2 is another schematic view of an embodiment of a successive approximation register analog-to-digital converter of the present invention.

FIG. 2 is another schematic view of an embodiment of a successive approximation register analog-to-digital converter of the present invention. The difference between embodiments shown in FIG. 2 and FIG. 1 is that the successive approximation register analog-to-digital converter 200 of FIG. 2 has an additional capacitor CC and a switch $SW_{Cc}$. The additional capacitor $C_C$ is coupled to the common node ND. In an embodiment, a sum of the total capacitance value of the capacitor group 110 and a capacitance value of the additional capacitor $C_C$ is equal to the total capacitance value of the capacitor group 120. In other embodiment, adjusting the capacitance values of the capacitors CB1~CBm of the capacitor group 120 and the capacitance value of the additional capacitor $C_C$ can adjust the voltage on the common node ND. For example, the voltage on the common node ND can be one third or one fourth of the voltage dvdd.

The switch $SW_{Cc}$ is coupled to the additional capacitor $C_C$, and configured to provide a voltage $V_3$ to the additional capacitor $C_C$, according to the control signal $S_{Cc}$. In an embodiment, the control signal $S_{Cc}$ is generated by the logic circuit 170. In the sampling mode, the switch $SW_{Cc}$ can provide the voltage $V_3$ to the additional capacitor $C_C$. In the data converting mode, when the control circuit 180 reads a voltage value of a specific capacitor of the capacitor group 110, the switch $SW_{Cc}$ stops providing the voltage $V_3$ to the additional capacitor $C_C$. At this time, the additional capacitor $C_C$ is at the electrical floating status.

In an embodiment, the voltage $V_3$ can be the ground voltage gnd. In another embodiment, the voltage $V_3$ can be equal to the voltage $V_2$. In other embodiment, the switch $SW_{Cc}$ can be omitted. In a condition that the switch $SW_{Cc}$ is omitted, the capacitor $C_C$ can directly receive the voltage $V_3$. In this example, when the control circuit 180 is operated in the sampling mode or the data converting mode, the additional capacitor $C_C$ can continuously receive the voltage $V_3$.

Figure 3:
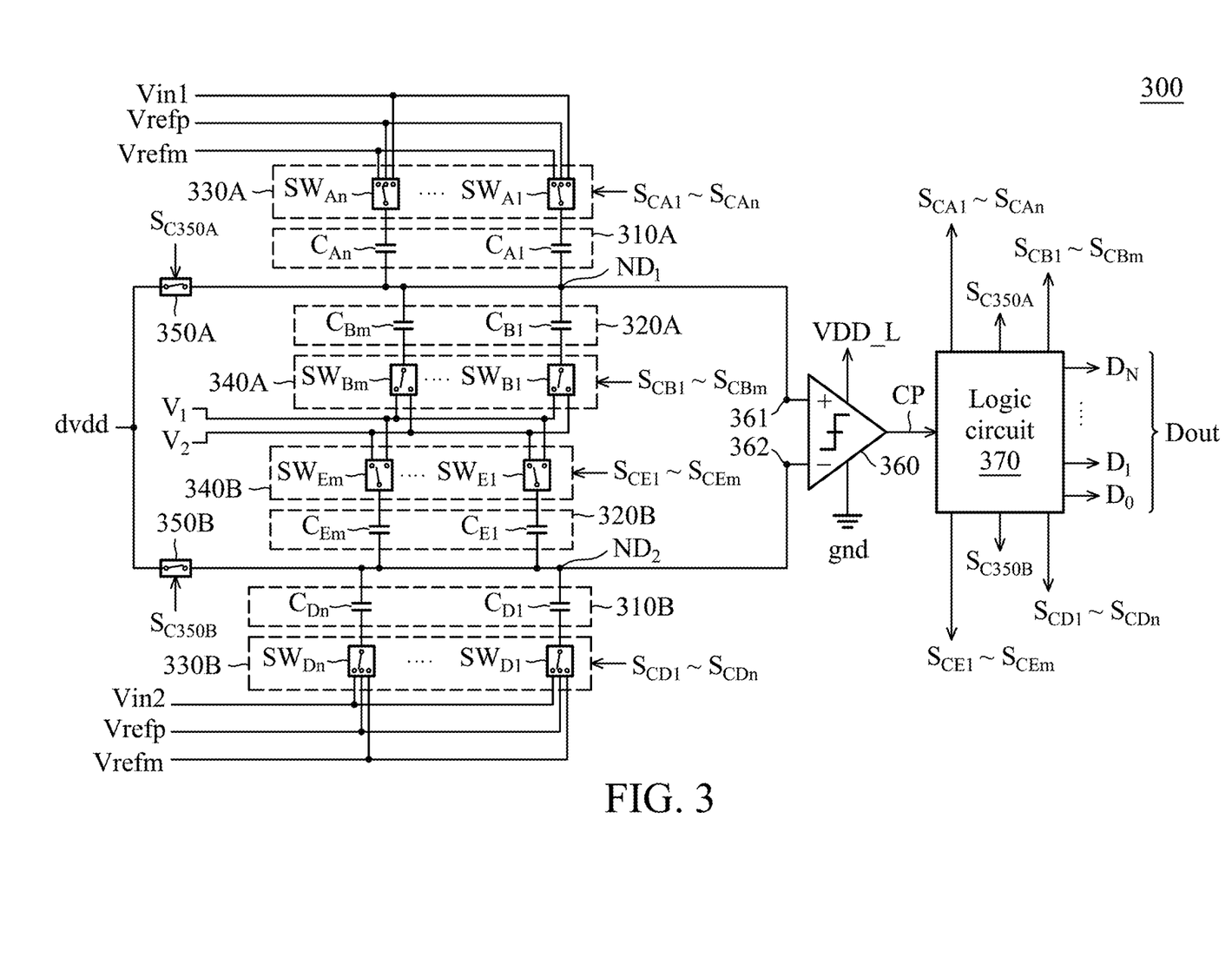
FIG. 3 is another schematic view of an embodiment of a successive approximation register analog-to-digital converter of the present invention.

FIG. 3 is another schematic view of an embodiment of a successive approximation register analog-to-digital converter of the present invention. In this embodiment, the successive approximation register analog-to-digital converter 300 can comprise capacitor groups 310A, 320A, 310B and 320B, switching circuits 330A, 340A, 330B, 340B, 350A and 350B, a comparator circuit 360, and a logic circuit 370.

The capacitor group 310A can includes the capacitors $C_{A1}$~$C_{An}$ electrically coupled to a common node $ND_1$. The capacitors $C_{A1}$~$C_{An}$ of the capacitor group 310A have the same characteristics as that of the capacitors $C_{A1}$~$C_{An}$ of the capacitor group 110 of FIG. 1, so detailed descriptions are not repeated herein. Furthermore, the capacitor group 320A can comprise capacitors $C_{B1}$~$C_{Bm}$ electrically coupled to the common node $ND_1$. The capacitors $C_{B1}$~$C_{Bm}$ of the capacitor group 320A have the same characteristics as that of the capacitors $C_{B1}$~$C_{Bm}$ of the capacitor group 120 of FIG. 1, so detailed descriptions are not repeated herein.

The switching circuit 330A can comprise switches $SW_{A1}$~$SW_{An}$. The switches $SW_{A1}$~$SW_{An}$ of the switching circuit 330A have similar characteristics to that of the switches $SW_{A1}$~$SW_{An}$ of the switching circuit 130 of FIG. 1, so detailed descriptions are not repeated herein. The switching circuit 340A can comprise switches $SW_{B1}$~$SW_{Bm}$. The switches $SW_{B1}$~$SW_{Bm}$ are coupled to the capacitors CB1~CBm, respectively. The switches $SW_{B1}$~$SW_{Bm}$ of the switching circuit 340A have the same characteristic as that of the switches $SW_{B1}$~$SW_{Bm}$ of the switching circuit 140 of FIG. 1, so detailed descriptions are not repeated herein. In other embodiment, the switching circuit 340A can comprise a plurality of buffers, which are not shown in FIG. 3, and each of the plurality of buffers can be coupled between the corresponding capacitor and corresponding switch. The switching circuit 340A has characteristic the same as that of the switching circuit 140 of FIG. 1, so detailed description is not repeated herein.

According to the control signal $S_{C350A}$, the switching circuit 350A can provide the voltage dvdd to the common node $ND_1$. The switching circuit 350A has characteristic similar to that of the switching circuit 150 of FIG. 1, so detailed description is not repeated herein.

The capacitor group 310B can comprise a plurality of capacitors $C_{D1}$~$C_{Dn}$ coupled to a common node $ND_2$. The capacitors $C_{D1}$~$C_{Dn}$ of the capacitor group 310B have characteristic similar to that of the capacitors $C_{A1}$~$C_{An}$ of the capacitor group 310A, so detailed descriptions are not repeated herein. In an embodiment, the number of the capacitors of the capacitor group 310B is the same as the number of the capacitors of the capacitor group 310A. In another embodiment, a total capacitance value of the capacitor group 310A can be the same as a total capacitance value of the capacitor group 310B.

The switching circuit 330B has a plurality of switches $SW_{D1}$~$SW_{Dn}$. According to the control signals $S_{CD1}$~$S_{CDn}$, the switches $SW_{D1}$~$SW_{Dn}$ can provide the analog signal Vin2, the reference voltage Vrefp or Vrefm to the capacitors $C_{D1}$~$C_{Dn}$ of the capacitor group 310B, respectively. In an embodiment, the analog signals Vin1 and Vin2 can be a differential signal pair. The switches $SW_{D1}$~$SW_{Dn}$ of the switching circuit 330B have characteristics similar to that of the switches $SW_{A1}$~$SW_{An}$ of the switching circuit 330A, so detailed descriptions are not repeated herein.

The capacitor group 320B can comprise a plurality of capacitors CE1~CEm coupled to the common node $ND_2$. The capacitors $C_{E1}$~$C_{Em}$ of the capacitor group 320B have the same characteristics as that of the capacitors $C_{B1}$~$C_{Bm}$ of the capacitor group 320A, so detailed descriptions are not repeated herein. In an embodiment, the number of the capacitors of the capacitor group 320B can be the same or different from the number of the capacitors of the capacitor group 320A. In another embodiment, a total capacitance value of the capacitor group 320B can be the same as a total capacitance value of the capacitor group 320A.

The switching circuit 340B can comprise a plurality of switches $SW_{E1}$~$SW_{Em}$. The switches $SW_{E1}$~$SW_{Em}$ are coupled to the capacitors $C_{E1}$~$C_{Em}$, respectively. The switches $SW_{E1}$~$SW_{Em}$ can provide the voltage $V_1$ or $V_2$ to the capacitors $C_{E1}$~$C_{Em}$ according to the control signal $S_{CE1}$~$S_{CEm}$, respectively. In other embodiment, the switching circuit 340B can comprise a plurality of buffers, which are not shown in FIG. 3, and each of the plurality of buffers can be coupled between the corresponding capacitor and corresponding switch. The switches $SW_{E1}$~$SW_{Em}$ of the switching circuit 340B have the same characteristics as that of the switches $SW_{B1}$~$SW_{Bm}$ of the switching circuit 340A, so detailed descriptions are not repeated herein.

The switching circuit 350B can provide the voltage dvdd to the common node $ND_2$ according to the control signal $S_{C350B}$. The switching circuit 350B has characteristic similar to that of the switching circuit 350A, so detailed description is not repeated herein.

The non-inverting input terminal 361 of the comparator circuit 360 is coupled to the common node $ND_1$, and the inverting input terminal 362 of the comparator circuit 360 is coupled to the common node $ND_2$. The comparator circuit 360 is configured to compare the voltages of the non-inverting input terminal 361 and the inverting input terminal 362, to generate a comparison result CP. The logic circuit 370 can generate a digital signal Dout, and the control signals $S_{CA1}$~$S_{CAn}$, $S_{CB1}$~$S_{CBm}$, $S_{CD1}$~$S_{CDn}$, $S_{CE1}$~$S_{CEm}$, $S_{C350A}$ and $S_{C350B}$, according to the comparison result CP. In this embodiment, the switching circuits 330A, 330B, 340A, 340B, 350A and 350B, and the logic circuit 370 can form a control circuit.

Within a first period of the sampling mode, the control circuit can provide the analog signal Vin1 to the capacitors $C_{A1}$~$C_{An}$ of the capacitor group 310A, and provide the analog signal Vin2 to the capacitors $C_{D1}$~$C_{Dn}$ of the capacitor group 310B. At this time, the control circuit can provide the voltage dvdd to the common nodes $ND_1$ and $ND_2$. Within the first period, the control circuit can provide the voltage $V_1$ to the capacitors $Cs_{B1}$~$C_{Bm}$ of the capacitor group 320A and the capacitors $C_{E1}$~$C_{Em}$ of the capacitor group 320B.

Within a second period of the sampling mode, the control circuit stops providing the voltage dvdd to the common nodes $ND_1$ and $ND_2$, and provides the voltage $V_2$ to the capacitors CB1~CBm of the capacitor group 320A and the capacitors $C_{E1}$~$C_{Em}$ of the capacitor group 320B. It is assumed that the total capacitance values of the capacitor groups 310A, 310B, 320A, and 320B are the same with each other. In this example, the voltages on the common nodes $ND_1$ and $ND_2$ are slightly equal to a half of the voltage dvdd.

In the data converting mode, the control circuit reads the voltage values of the capacitors of the capacitor groups 310A and 310B in sequence. In this embodiment, each when the control circuit reads the voltage value of at least one specific capacitor of the capacitor group 310A, the control circuit makes a capacitor of the capacitor group 320A electrically floating. Similarly, each when the control circuit reads a voltage value of at least one specific capacitor of the capacitor group 310B, the control circuit makes a capacitor of the capacitor group 320B electrically floating.

In this paragraph, the capacitor group 310A is taken as example for illustration. After the control circuit reads the voltage value of a capacitor of the capacitor group 310A, the control circuit makes a capacitor of the capacitor group 320A electrically floating. As a result, after the control circuit reads the voltage values of all capacitors of the capacitor group 310A, all capacitors of the capacitor group 320A are at the floating state.

Figure 4:
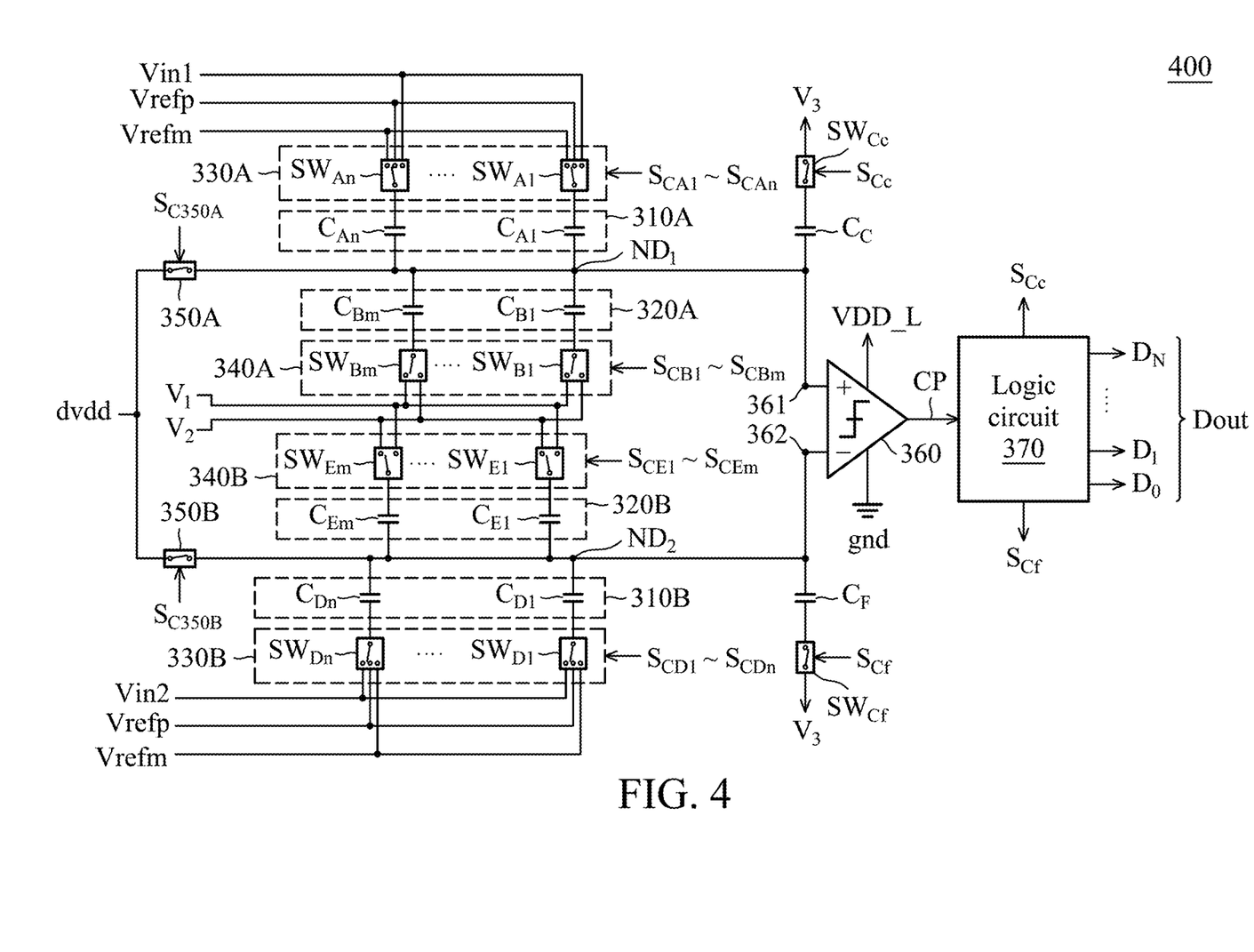
FIG. 4 is another schematic view of an embodiment of a successive approximation register analog-to-digital converter of the present invention.

FIG. 4 is another schematic view of an embodiment of a successive approximation register analog-to-digital converter of the present invention. The difference between the embodiments of FIG. 4 and FIG. 3 is that the successive approximation register analog-to-digital converter of FIG. 4 includes additional capacitors $C_C$ and $C_F$, and switches $SW_{Cc}$ and $SW_{Cf}$. As shown in FIG. 4, the additional capacitor $C_C$ is coupled to the common node $ND_1$. In an embodiment, a sum of the total capacitance value of the capacitor group 310A and the capacitance value of the additional capacitor $C_C$ is equal to the total capacitance value of the capacitor group 320A. In other embodiment, adjusting the capacitance values of the capacitors $C_{B1}$~$C_{Bm}$ of the capacitor group 320A and the capacitance value of the additional capacitor $C_C$ can adjust the voltage on the common node $ND_1$. For example, the voltage on the common node $ND_1$ can be one third or one fourth of the voltage dvdd.

The switch $SW_{Cc}$ is coupled to the additional capacitor $C_C$, and configured to provide the voltage $V_3$ to the additional capacitor $C_C$ according to the control signal $S_{Cc}$. In an embodiment, the control signal $S_{Cc}$ is generated by the logic circuit 370. In the sampling mode, the switch $SW_{Cc}$ can provide the voltage $V_3$ to the additional capacitor $C_C$. In the data converting mode, each when the voltage value of a specific capacitor of the capacitor group 310A is read, the switch $SW_{Cc}$ stops providing the voltage $V_3$ to the additional capacitor $C_C$, and at this time, the additional capacitor $C_C$ is at the electrically floating status.

The additional capacitor $C_F$ is coupled to the common node $ND_2$. In an embodiment, a sum of the total capacitance value of the capacitor group 310B and the capacitance value of the additional capacitor $C_F$ is equal to the total capacitance value of the capacitor group 320B. The additional capacitor $C_F$ has the same characteristic as that of the additional capacitor $C_C$, so detailed description is not repeated herein. The switch $SW_{Cf}$ is coupled to the additional capacitor $C_F$, and configured to provide the voltage $V_3$ to the additional capacitor $C_F$ according to the control signal $S_{Cf}$. The switch $SW_{Cf}$ has the same characteristic as that of the switch $SW_{Cc}$, so detailed description is not repeated herein.

In an embodiment, the voltage $V_3$ can be the ground voltage gnd. In another embodiment, the voltage $V_3$ can be equal to the voltage $V_2$. In other embodiment, at least one of the switch $SW_{Cc}$, and the $SW_{Cf}$ can be omitted. For example, in a condition that the switch $SW_{Cc}$ is omitted, the capacitor $C_C$ can directly receive the voltage $V_3$. In this example, when the control circuit 180 is operated in the sampling mode or the data converting mode, the additional capacitor $C_C$ can continuously receive the voltage $V_3$.

FIGS. 5A to 5E are schematic views of operations of a successive approximation register analog-to-digital converter of the present invention. For convenience in explanation, FIGS. 5A to 5E merely show switches 511~515, capacitor groups 520 and 530, buffers 551 and 552, and a comparator circuit 540, but the present invention is not limited thereto. In other embodiment, the successive approximation register analog-to-digital converter 500 can have other number of switches and buffers. In some embodiments, the successive approximation register analog-to-digital converter 500 can comprise a logic circuit, such as the logic circuit 170 of FIG. 1.

In this embodiment, the capacitor groups 520 and 530 have characteristics similar to that of the capacitor groups 110 and 120 of FIG. 1. For convenience in explanation, in FIG. 5, the capacitor group 520 merely has the capacitors 511 and 512, and the capacitor group 530 merely has the capacitors 531 and 532. In this embodiment, the capacitance value of the capacitor 511 is higher than that of the capacitor 512. Furthermore, the capacitance values of the capacitors 531 and 532 are equal to that of the capacitors 521 and 522, respectively. In other embodiment, each of the capacitor groups 520 and 530 can have other number of capacitors. Furthermore, according to a corresponding control signal, each of the switches 511~515 can transmit a correspond voltage to one of the capacitors corresponding thereto. For convenience in explanation, the control signal is not shown in FIGS. 5A and 5E.

Figure 5A:
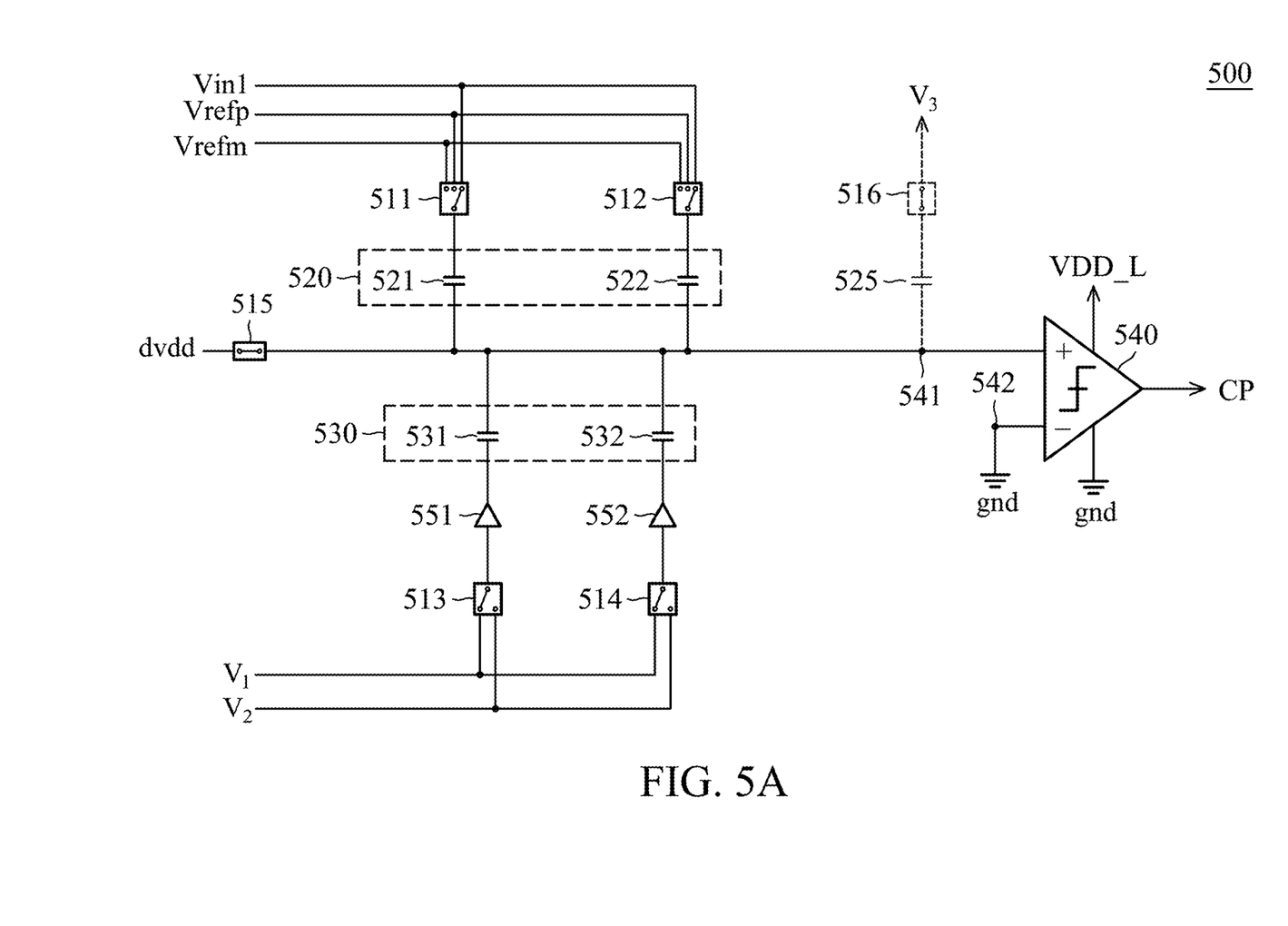
FIGS. 5A to 5E are schematic view of operations of an embodiment of a successive approximation register analog-to-digital converter of the present invention.
Figure 5B:
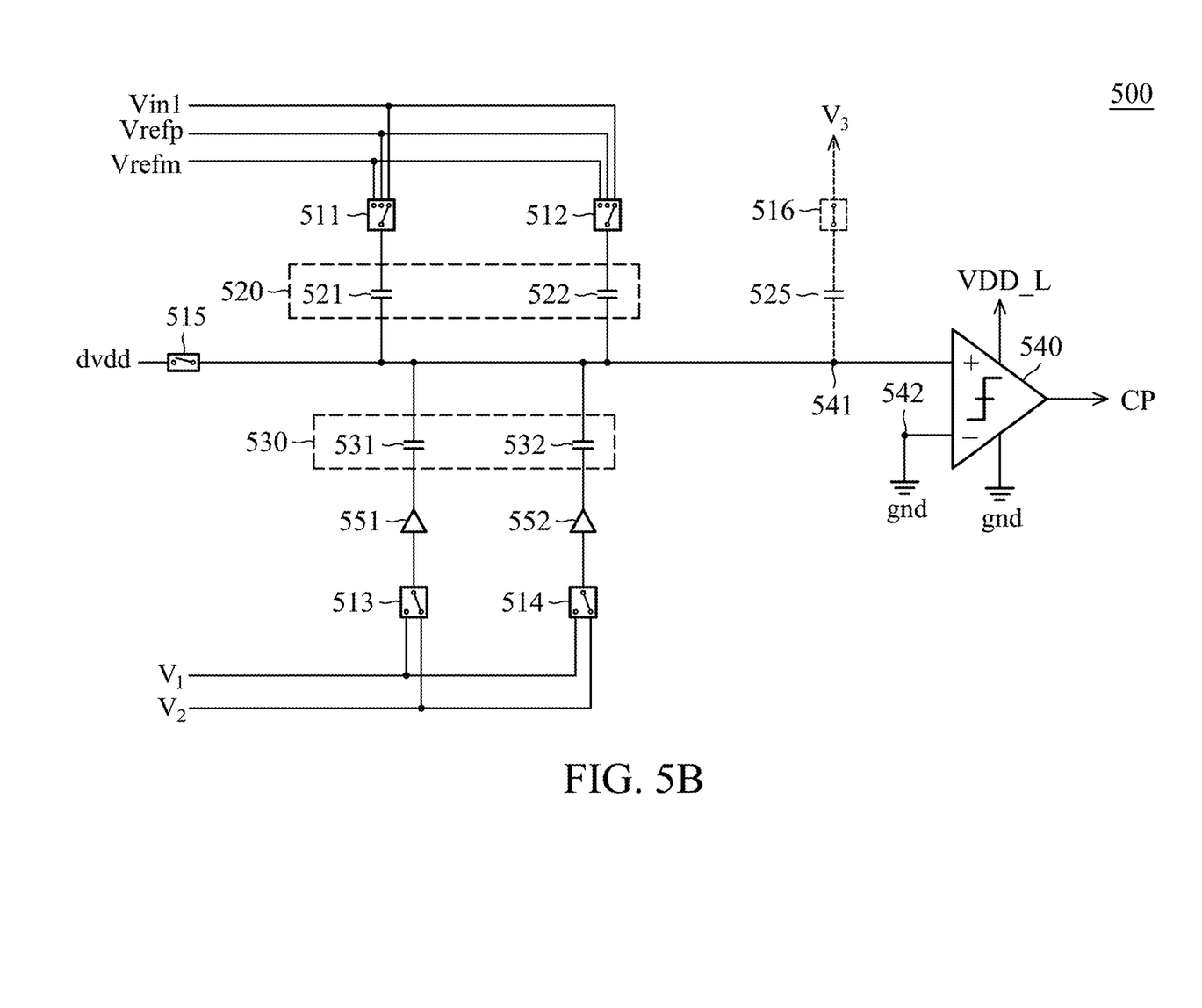

As shown in FIGS. 5A and 5B, the successive approximation register analog-to-digital converter 500 is operated in the sampling mode. Please refer to FIG. 5A, within a first period, the switches 511 and 512 can provide the analog signal Vin1 to the capacitors 521 and 522, and the switches 513 and 514 can provide the voltage $V_1$ to the capacitors 531 and 532, and at this time, the switch 515 can provide the voltage dvdd to a first non-inverting input terminal 541. In other embodiment, the successive approximation register analog-to-digital converter 500 can comprise an additional capacitor 525 and a switch 516. In this example, within the first period, the switch 516 can provide the voltage $V_3$ to the additional capacitor 525.

Please refer to FIG. 5B, in a second period, the switches 513 and 514 can provide the voltage $V_2$ to the capacitors 531 and 532, and the switch 515 stops providing the voltage dvdd to the first non-inverting input terminal 541, and at this time, the switches 511 and 512 continuously provide the analog signal Vin1 to the capacitors 521 and 522, respectively. Furthermore, the switch 516 continuously provides the voltage $V_3$ to the additional capacitor 525.

Figure 5C:
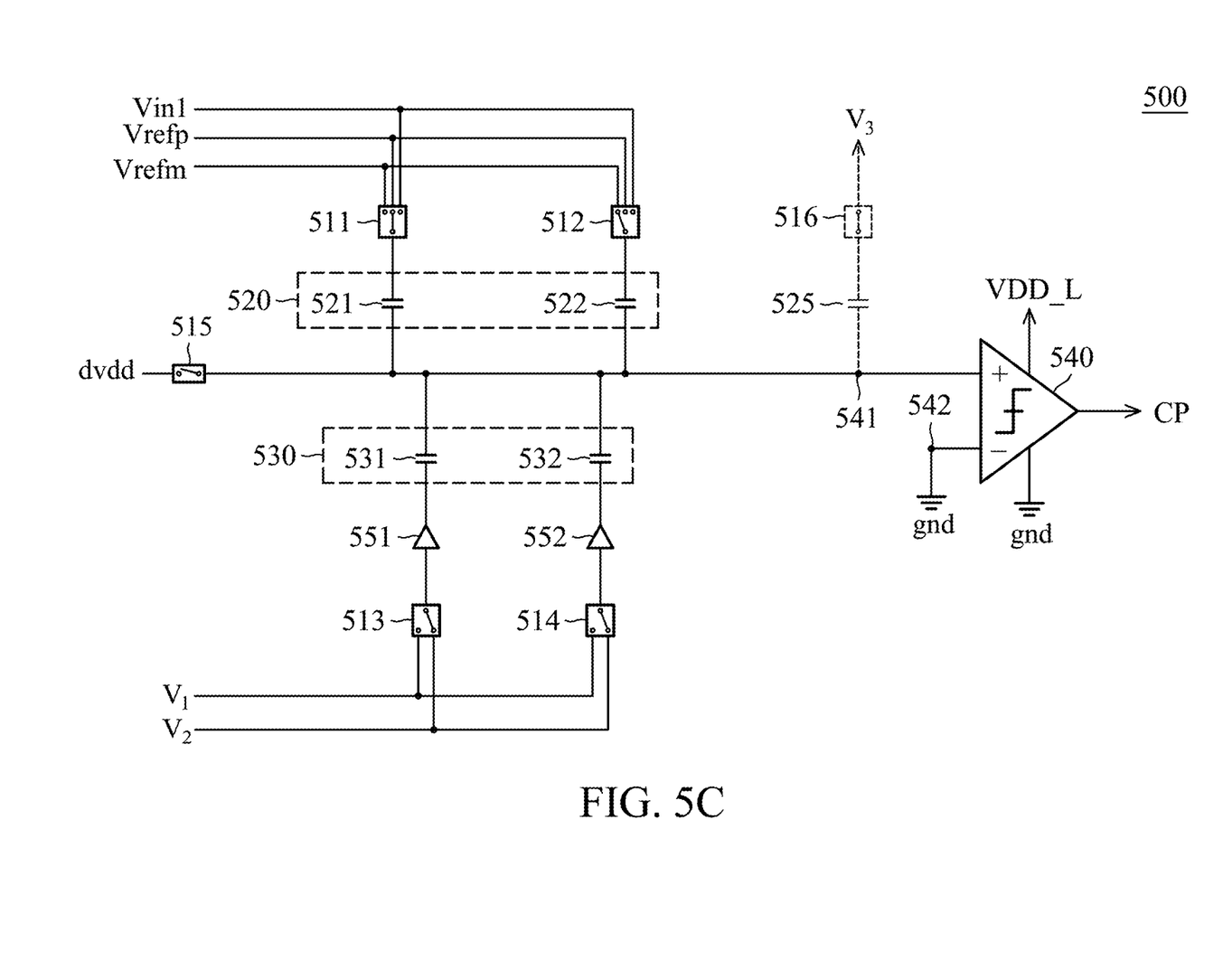
Figure 5D:
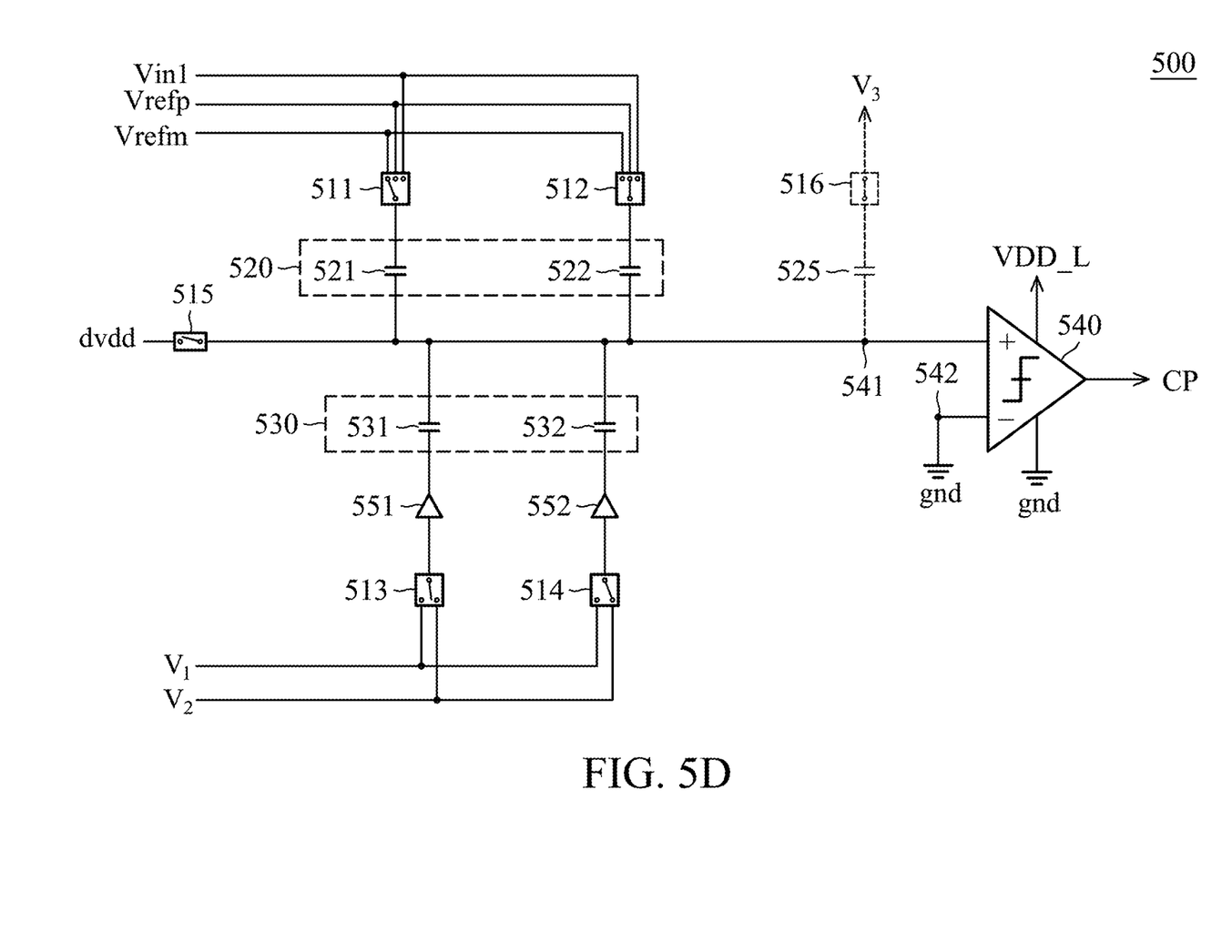

As shown in FIGS. 5C and 5D, the successive approximation register analog-to-digital converter 500 are operated in a data converting mode. In the data converting mode, which is also called a third period, the successive approximation register analog-to-digital converter 500 can read the voltage of the capacitor 521. In an embodiment, the switch 511 can provide the reference voltage Vrefp to the capacitor 521, and the switch 512 can provide the reference voltage Vrefm to the capacitor 522. The comparator circuit 540 can compare the voltages of the non-inverting input terminal 541 and the inverting input terminal 542, to generate the comparison result CP. According to the comparison result CP, the logic circuit, which is not shown in FIGS. 5C and 5D, can obtain the voltage of the capacitor 521. For example, when the voltage of the capacitor 521 is higher than a first preset value, the switch 511 constantly provides the reference voltage Vrefp to the capacitor 521, and when the voltage of the capacitor 521 is lower than the first preset value, the switch 511 constantly provides the reference voltage Vrefm to the capacitor 521.

It is assumed that the voltage of the capacitor 521 is lower than the first preset value. As shown in FIG. 5D, within a fourth period, the switch 511 can provide the reference voltage Vrefm to the capacitor 521. Within the fourth period, the successive approximation register analog-to-digital converter 500 can read the voltage of the capacitor 522, and the switch 512 can provide the reference voltage Vrefp to the capacitor 522. In an embodiment, within the fourth period, the switch 513 stops providing the voltage $V_2$ to the capacitor 531. As a result, a voltage of a terminal of the capacitor 531 is at a floating voltage-level.

In the fourth period, the comparator circuit 540 can generate the comparison result CP according to the voltages of the non-inverting input terminal 541 and the inverting input terminal 542. The logic circuit, which is not shown in FIGS. 5C and 5D, can obtain the voltage of the capacitor 522 according to the comparison result CP. Similarly, when the voltage of the capacitor 521 is higher than a second preset value, the switch 512 constantly provides the reference voltage Vrefp to the capacitor 522, and when the voltage of the capacitor 522 is lower than the second preset value, the switch 512 constantly provides the reference voltage Vrefm to the capacitor 522.

Figure 5E:
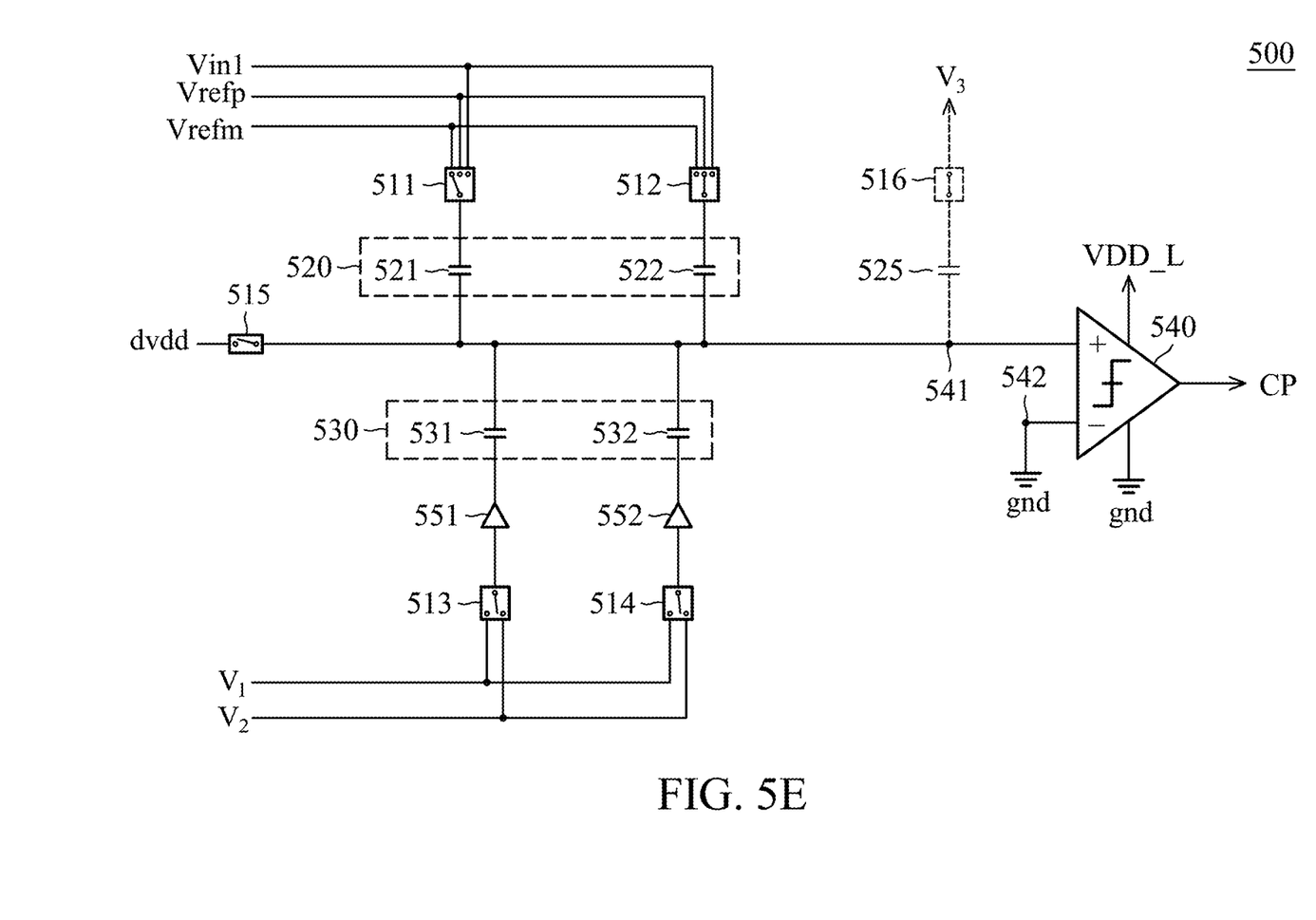

It is assumed that the voltage of the capacitor 522 is higher than the second preset value, as shown in FIG. 5E, the switch 512 can provide the reference voltage Vrefp to the capacitor 522. In an embodiment, after obtaining the voltage of the capacitor 522, the switch 514 stops providing the voltage $V_2$ to the capacitor 532. As a result, a voltage of a terminal of the capacitor 532 is at the floating voltage-level. In other embodiment, when each of the capacitor group 520 and 530 includes more capacitors, each when the voltage of a specific capacitor of the capacitor group 520 is read, a capacitor of the capacitor group 530 is at the electrically floating status.

The present invention does not limit when the switches 513 and 514 stop transmitting the voltage to the capacitors 531 and 532. In an embodiment, after obtaining the voltage of the capacitor 521, the switch 513 can stop providing the voltage $V_2$ to the capacitor 531. In this example, after obtaining the voltage of the capacitor 522, the switch 514 can stop providing the voltage $V_2$ to the capacitor 532. In other embodiment, after obtaining the voltage of the capacitor 521, the switch 513 can continuously provide the voltage $V_2$ to the capacitor 531, and after obtaining the voltage of the capacitor 522, the switch 513 can stop providing the voltage $V_2$ to the capacitor 531.

The capacitors of the capacitor group 530 are electrically floated gradually, so the resolution of the successive approximation register analog-to-digital converter 500 can be prevented from affecting. Furthermore, within the second period of the sampling mode, the manner of stopping providing the voltage dvdd to the first non-inverting input terminal and providing the voltage $V_2$ to the capacitors 531 and 532 can prevent the input voltage of the comparator circuit 540 from being out of a preset range, such as higher than the operation voltage VDD_L of the comparator circuit 540.

Figure 6:
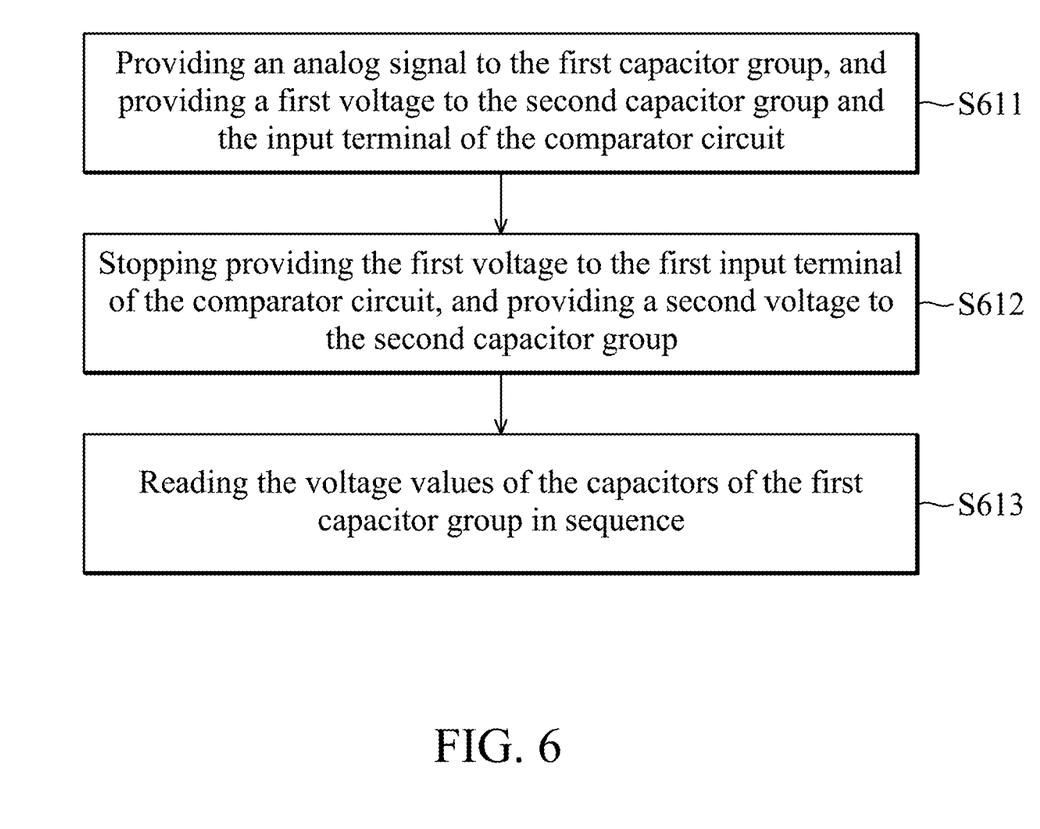
FIG. 6 is a flowchart of a control method for a successive approximation register analog-to-digital converter, according to the present invention.

FIG. 6 is a flowchart of an embodiment of a control method of the present invention. The control method of the present invention is applicable to a successive approximation register analog-to-digital converter comprising a first capacitor group, a second capacitor group and a comparator circuit. The first and second capacitor groups are coupled to an input terminal of the comparator circuit. For convenience in explanation, the successive approximation register analog-to-digital converter 100 of FIG. 1 is taken as example in following paragraphs.

In a step S611, within a first period, an analog signal (such as the voltage Vin1) is provided to the first capacitor group, such as the capacitor group 110, and a first voltage (such as the voltage $V_1$) is provided to the second capacitor group, such as the capacitor group 120, and the input terminal of the comparator circuit, such as the input terminal 161. In an embodiment, the first voltage can be slightly equal to a high operation voltage of the comparator circuit.

In a step S612, within a second period, it stops providing the first voltage to the first input terminal of the comparator circuit, such as the input terminal 161, and a second voltage (such as the voltage $V_2$) is provided to the second capacitor group, such as the capacitor group 120. Within this period, the first capacitor group (such as the capacitor group 110) continuously receives the analog signal (such as the voltage Vin1). In an embodiment, the second voltage is slightly equal to a low operation voltage of the comparator circuit.

In a step S613, within a third period, the voltage values of the capacitors of the first capacitor group (such as the capacitor group 110) are read in sequence. Since the manner of reading the voltage values of the capacitors is shown in FIGS. 5C to 5E, detailed description is not repeated herein. In this embodiment, each when the voltage value of at least one specific capacitor of the first capacitor group (such as the capacitor group 110) is read, a capacitor of the second capacitor group (such as the capacitor group 120) is electrically floated. For example, when the voltage value of the capacitor $C_{An}$ is read, the capacitor $C_{Bm}$ is electrically floated; when the voltage value of the capacitor $C_{An-1}$ is read, the capacitor $C_{Bm-1}$ is electrically floated.

In other embodiment, the successive approximation register analog-to-digital converter can include an additional capacitor, such as the additional capacitor $C_C$ of FIG. 2. In this example, within the first to third periods, the third voltage (such as $V_3$) is provided to the additional capacitor $C_C$. In another embodiment, when the voltage value of a specific capacitor (such as the capacitor $C_{A1}$) of the first capacitor group (such as the capacitor group 110) is read, the additional capacitor $C_C$ is electrically floated.

The control method of the present invention, or a specific type or a part thereof, can be performed by codes which can be stored in a physical medium such as a floppy disc, a compact disc, a hard disk, or any machine-readable storage medium (such as computer-readable storage medium, or a computer program product. When the codes are loaded into and executed by a machine, such as a computer, the machine is involved in execution of the present invention. The codes can be transmitted through transmission medium such as an electric wire, a cable, or a fiber, in any transmission format, and when the codes are loaded into and executed by the machine, such as the computer, the machine is involved in the execution of the present invention. When the concept of the present invention is implemented by a general-purpose processing unit, the codes combined with the processing unit can provide an operation similar to that of a unique device with a specific application logic circuit.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A successive approximation register analog-to-digital converter, applied to convert a first analog signal into a digital signal, comprising:
a first capacitor group comprising a plurality of capacitors directly connected to a common node;
a second capacitor group comprising a plurality of capacitors directly connected to the common node;

a comparator circuit comprising a first input terminal and a second input terminal, and configured to generate a comparison result according to voltages of the first input terminal and the second input terminal, wherein the first input terminal is directly connected to the common node; and a control circuit configured to generate the digital signal according to the comparison result;

wherein when the control circuit is operated in a sampling mode, within a first period the control circuit provides the first analog signal to the all capacitors of the first capacitor group and provides a first voltage to the common node and the all capacitors of the second capacitor group, and within a second period the control circuit stops providing the first voltage to the common node, and provides a second voltage to the all capacitors of the second capacitor group; and wherein when the control circuit is operated in a data converting mode, the control circuit reads the voltage values of the capacitors of the first capacitor group in sequence, and when the control circuit reads a voltage value of at least one specific capacitor of the first capacitor group, the control circuit makes one of the capacitors of the second capacitor group electrically floating.

2. The successive approximation register analog-to-digital converter according to claim 1, wherein the control circuit comprises:

a first switch configured to output a first reference voltage, a second reference voltage or the first analog signal to a first capacitor of the first capacitor group according to a first control signal;

a second switch configured to output the first reference voltage, the second reference voltage or the first analog signal, to a second capacitor of the first capacitor group, according to a second control signal;

a third switch configured to output the first voltage or the second voltage to a third capacitor of the second capacitor group, according to a third control signal;

a fourth switch configured to provide the first voltage to the common node according to a fourth control signal; and a logic circuit configured to generate the digital signal, and the first, second, third and fourth control signals, according to the comparison signal.

3. The successive approximation register analog-to-digital converter according to claim 2, wherein the third capacitor has a first terminal coupled to the third switch, and a second terminal coupled to the common node, and after the control circuit reads a voltage value of a first specific capacitor of the first capacitor group, the third switch stops providing any of the first voltage and the second voltage to the first terminal.

4. The successive approximation register analog-to-digital converter according to claim 2, wherein after the control circuit reads a voltage value of a second specific capacitor of the first capacitor group, the control circuit makes a fourth capacitor of the second capacitor group electrically floating.

5. The successive approximation register analog-to-digital converter according to claim 4, wherein the fourth capacitor has a third terminal coupled to a fifth switch, and a fourth terminal coupled to the common node, and within the first period, the fifth switch provides the first voltage to the third terminal, and within the second period, the fifth switch provides the second voltage to the third terminal, and after the control circuit reads the voltage value of the second specific capacitor, the fifth switch stops providing any of the first voltage and the second voltage to the third terminal.

6. The successive approximation register analog-to-digital converter according to claim 1, further comprising:

a first additional capacitor coupled to the common node, wherein when the control circuit is operated in the sampling mode or the data converting mode, the first additional capacitor receives a third voltage.

7. The successive approximation register analog-to-digital converter according to claim 6, wherein a sum of a total capacitance value of the first capacitor group and a capacitance value of the first additional capacitor is equal to a total capacitance value of the second capacitor group.

8. The successive approximation register analog-to-digital converter according to claim 6, wherein the third voltage is a ground voltage.

9. The successive approximation register analog-to-digital converter according to claim 6, wherein the third voltage is equal to the second voltage.

10. The successive approximation register analog-to-digital converter according to claim 1, wherein the comparator circuit receives a first operating voltage and a second operating voltage, the first voltage is equal to the first operating voltage, and the second voltage is equal to the second operating voltage.

11. The successive approximation register analog-to-digital converter according to claim 1, wherein the number of the capacitors of the second capacitor group is the same as the number of the capacitors of the first capacitor group.

12. The successive approximation register analog-to-digital converter according to claim 1, wherein a total capacitance value of the first capacitor group is equal to a total capacitance value of the second capacitor group.

13. The successive approximation register analog-to-digital converter according to claim 2, further comprising:

a third capacitor group comprising a plurality of capacitors coupled to the second input terminal of the comparator circuit;

a fourth capacitor group comprising a plurality of capacitors coupled to the second input terminal of the comparator circuit;

wherein within the first period, the control circuit provides a second analog signal to the all capacitors of the third capacitor group, and provides the first voltage to the second input terminal of the comparator circuit and the all capacitors of the fourth capacitor group, and within the second period, the control circuit stops providing the first voltage to the second input terminal of the comparator circuit, and provides the second voltage to the all capacitors of the fourth capacitor group;

wherein within the data converting mode, the control circuit reads the voltage values of the all capacitors of the third capacitor group in sequence, and when the control circuit reads a voltage value of at least one specific capacitor of the third capacitor group, the control circuit makes a capacitor of the fourth capacitor group electrically floating.

14. The successive approximation register analog-to-digital converter according to claim 13, wherein the control circuit comprises:

a sixth switch configured to output the first reference voltage, the second reference voltage or the second analog signal to a fifth capacitor of the third capacitor group, according to a sixth control signal;

a seventh switch configured to output the first reference voltage, the second reference voltage or the second analog signal to a sixth capacitor of the third capacitor group, according to a seventh control signal;

an eighth switch configured to output the first voltage or the second voltage to a seventh capacitor of the fourth capacitor group, according to an eighth control signal;

a ninth switch configured to provide the first voltage to the second input terminal of the comparator circuit, according to the ninth control signal;

wherein the logic circuit generates the sixth, seventh, eighth and ninth control signals, according to the comparison signal.

15. The successive approximation register analog-to-digital converter according to claim 14, wherein after the control circuit reads a voltage value of a third specific capacitor of the third capacitor group, the eighth switch stops providing any of the first voltage and the second voltage to the seventh capacitor.

16. The successive approximation register analog-to-digital converter according to claim 14, further comprising:
an eighth capacitor coupled to the second input terminal; and
a tenth switch configured to output the first voltage or the second voltage to the eighth capacitor according to a tenth control signal;
wherein within the first period, the tenth switch provides the first voltage to the eighth capacitor, and within the second period, the tenth switch provides the second voltage to the eighth capacitor, and after the control circuit reads a voltage value of a fourth specific capacitor of the third capacitor group, the tenth switch stops providing any of the first voltage and the second voltage to the eighth capacitor.

17. The successive approximation register analog-to-digital converter according to claim 14, further comprising:
a second additional capacitor coupled to the second input terminal of the comparator circuit, wherein when the control circuit is operated in the sampling mode or the data converting mode, the second additional capacitor receives the third voltage.

18. The successive approximation register analog-to-digital converter according to claim 17, wherein the comparator circuit receives a first operating voltage and a second operating voltage, the first voltage is equal to the first operating voltage, and the second and third voltages is equal to the second operating voltage.

19. A control method, applicable to a successive approximation register analog-to-digital converter comprising a first capacitor group, a second capacitor group and a comparator circuit, wherein the first capacitor group and the second capacitor group are coupled to an input terminal of the comparator circuit, and the control method comprises:
within a first period:
providing an analog signal to the first capacitor group; and
providing a first voltage to the second capacitor group and the input terminal of the comparator circuit;
within a second period:
stopping providing the first voltage to the input terminal of the comparator circuit; and
providing a second voltage to the second capacitor group; and
within a third period:
reading voltage values of the plurality of capacitors of the first capacitor group in sequence; and
making a capacitor of the second capacitor group electrically floating when a voltage value of at least one specific capacitor of the first capacitor group is read,
wherein the first capacitor group and the second capacitor group are directly connected to the input terminal of the comparator circuit.

20. The control method according to claim 19, further comprising:
within the first, the second and third periods, providing a third voltage to an additional capacitor which is coupled to the input terminal of the comparator circuit.

* * * * *